United States Patent
Kataoka et al.

(10) Patent No.: US 9,040,165 B2
(45) Date of Patent: May 26, 2015

(54) SOLAR CELL SEALING FILM AND SOLAR CELL

(75) Inventors: Hisataka Kataoka, Yokohama (JP); Makiko Tomiyama, Yokohama (JP)

(73) Assignee: BRIDGESTONE CORPORATION, Tokyo (JP)

( * ) Notice: Subject to any disclaimer, the term of this patent is extended or adjusted under 35 U.S.C. 154(b) by 41 days.

(21) Appl. No.: 13/512,114

(22) PCT Filed: Oct. 20, 2010

(86) PCT No.: PCT/JP2010/068434
§ 371 (c)(1),
(2), (4) Date: May 25, 2012

(87) PCT Pub. No.: WO2011/065157
PCT Pub. Date: Jun. 3, 2011

(65) Prior Publication Data
US 2012/0285529 A1    Nov. 15, 2012

(30) Foreign Application Priority Data

Nov. 26, 2009    (JP) .................. 2009-268313

(51) Int. Cl.
*H01L 31/048*    (2014.01)
*C08F 255/02*    (2006.01)

(52) U.S. Cl.
CPC ............. *H01L 31/0481* (2013.01); *Y02E 10/50* (2013.01); *C08F 255/02* (2013.01)

(58) Field of Classification Search
CPC combination set(s) only.
See application file for complete search history.

(56) References Cited

U.S. PATENT DOCUMENTS

| 7,332,216 B2 * | 2/2008 | Hashimoto et al. | 428/331 |
| 7,438,978 B2 * | 10/2008 | Kotsubo et al. | 428/483 |
| 8,148,625 B2 * | 4/2012 | Kataoka | 136/243 |
| 2008/0274245 A1 * | 11/2008 | Lee et al. | 426/394 |
| 2012/0077911 A1 * | 3/2012 | Haraguchi et al. | 524/140 |

FOREIGN PATENT DOCUMENTS

| JP | 2007-123488 A | 5/2007 |
| JP | 2007-281135 A | 10/2007 |
| JP | 2008-053379 A | 3/2008 |
| JP | 2008-98457 A | 4/2008 |
| JP | 2009-135200 A | 6/2009 |

\* cited by examiner

*Primary Examiner* — Elizabeth A Robinson
*Assistant Examiner* — Daniel D Lowrey
(74) *Attorney, Agent, or Firm* — Sughrue Mion, PLLC

(57) ABSTRACT

A solar cell sealing film contains an ethylene-unsaturated ester copolymer, a crosslinker, and crosslinking auxiliary agents, wherein the solar cell sealing film contains a polyfunctional (meth)acrylate having 5 or more (meth)acryloyl groups in the molecule and triallyl isocyanurate as the crosslinking auxiliary agents, and a mass ratio of the polyfunctional (meth)acrylate to the triallyl isocyanurate is 0.06 to 0.3 parts of polyfunctional (meth)acrylate per 1 part of triallyl isocyanurate.

6 Claims, 1 Drawing Sheet

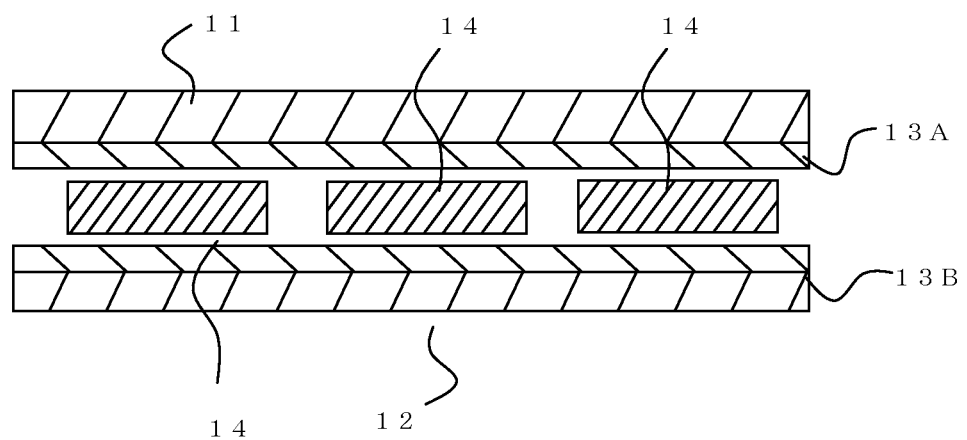

SOLAR CELL SEALING FILM AND SOLAR CELL

CROSS REFERENCE TO RELATED APPLICATIONS

This application is a National Stage of International Application No. PCT/JP2010/068434 filed Oct. 20, 2010, claiming priority based on Japanese Patent Application No. 2009-268313 filed Nov. 26, 2009, the contents of all of which are incorporated herein by reference in their entirety.

TECHNICAL FIELD

The present invention relates to a solar cell sealing film comprising chiefly ethylene-unsaturated ester copolymer, particularly a solar cell sealing film having superior productivity and resistance properties to moisture and heat.

BACKGROUND ART

In recent year, a solar cell (solar cell module) has been widely employed as a device directly converting solar energy into electric energy from the viewpoints of effective use of natural resources and ecology. Further development of solar cells is in progress.

A solar cell generally has a structure that photovoltaic elements are sealed through a light-receiving side sealing film and a backside sealing film between a transparent light-receiving side protection material and a backside protection material (backside covering member). In order to generate a large electrical output, a conventional solar cell is employed in the form of a solar cell module having plural photovoltaic elements connected to each other. Therefore, sealing films having high insulation properties are employed for ensuring an electrical insulation property.

In the solar cell, it is strongly required to take in incident light into photovoltaic elements as effectively as possible in term of improvement of generating efficiency. Therefore, it is desired that a light-receiving side sealing film has transparency as high as possible and does not absorb and reflect incident solar light so that it transmits most of the incident solar light.

In the light of transparency, films made of ethylene-unsaturated ester copolymer such as ethylene-vinyl acetate copolymer (EVA) are used as solar cell sealing films. Furthermore, addition of crosslinkers such as organic peroxides to the ethylene-unsaturated ester copolymer for improving crosslink density brings about improvements of strength and durability of the sealing film.

Moreover, Patent Document 1 shows that addition of a compound containing alkyleneoxy group such as tetraethylene glycol di(meth)acrylate brings about an improvement of transparency of the sealing film.

A solar cell is, for example, prepared by superposing a transparent light-receiving side protection material, a light-receiving side sealing film, plural photovoltaic elements, a backside sealing film and a backside protection material (backside covering member) in this order to give a laminate, and subsequently pressing the laminate under heating to crosslink or cure a light-receiving side sealing film and a backside sealing film. Thus, the laminate is adhesively combined by crosslinking or curing a light-receiving side sealing film and a backside sealing film.

PATENT DOCUMENT

Prior Art Documents

Patent Document 1: JP (TOKKAI) 2008-053379 A

SUMMARY OF THE INVENTION

Problem to be Solved by the Invention

However, the process for crosslinking or curing the sealing film generally requires tens or more of minutes. The crosslinking or curing step exclusively makes a time period for preparing a solar cell longer.

Furthermore, when a solar cell is used in high temperature and humidity environment such as summertime over a long duration, the sealing film may become cloudy. The clouded sealing film may cause reduction of solar light transmittance and poor appearance of the solar cell.

It is therefore an object of the present invention to provide a solar cell sealing film that the crosslinking or curing time is reduced, and high transparency is maintained in high temperature and humidity environment over a long duration.

Means for Solving Problem

The above object is solved by the present invention, i.e., a solar cell sealing film, comprising an ethylene-unsaturated ester copolymer, a crosslinker, and crosslinking auxiliary agents, wherein the solar cell sealing film comprises a polyfunctional (meth)acrylate having 5 or more (meth)acryloyl groups in the molecule and triallyl isocyanurate as the crosslinking auxiliary agents, and a mass ratio of the polyfunctional (meth)acrylate to the triallyl isocyanurate is 0.06 to 0.3.

Preferred embodiments of the solar cell sealing film according to the present invention are described as follows:

(1) The content of the triallyl isocyanurate is preferably 0.5 to 7.5 parts by weight based on 100 parts by weight of the ethylene-unsaturated ester copolymer.

(2) The polyfunctional (meth)acrylate is preferably dipentaerythritol hexa(meth)acrylate, because the crosslinking or curing time of the sealing film can be significantly reduced.

(3) The content of the polyfunctional (meth)acrylate is preferably 0.15 to 0.5 parts by weight based on 100 parts by weight of the ethylene-unsaturated ester copolymer.

(4) The content of the crosslinker is 1.0 to 2.0 parts by weight based on 100 parts by weight of the ethylene-unsaturated ester copolymer. The use of the crosslinker in the foregoing content can adequately bring out excellent bonds showing sufficient resistance to cleavage caused by the influence of heat and moisture on the ethylene-unsaturated ester copolymer, whereby heat and moisture resistance of the sealing film can be improved.

Advantageous Effects of the Invention

According to the solar cell sealing film of the present invention, a polyfunctional (meth)acrylate and triallyl isocyanurate are combined in the specified ratio. Therefore, the solar cell sealing film of the present invention can be crosslinked or cured in a short time. Furthermore, the sealing film can maintain high transparency in high temperature and humidity environment, and also show superior heat and moisture resistance.

BRIEF DESCRIPTION OF THE DRAWINGS

FIG. 1 is an illustrative drawing of a solar cell.

DESCRIPTION OF EMBODIMENTS

A solar cell sealing film of the present invention comprises an ethylene-unsaturated ester copolymer, a crosslinker, and crosslinking auxiliary agents as basic components. As crosslinking auxiliary agents, a polyfunctional (meth)acrylate having 5 or more (meth)acryloyl groups in the molecule and triallyl isocyanurate are employed so that a mass ratio of the polyfunctional (meth)acrylate to the triallyl isocyanurate is in the range of 0.06 to 0.3. The use of a polyfunctional (meth)acrylate having 5 or more (meth)acryloyl groups in the molecule enables to reduce a crosslinking or curing time of the sealing film. Furthermore, the use of the polyfunctional (meth)acrylate and the triallyl isocyanurate in the specified ratio can bring out excellent bonds showing sufficient resistance to cleavage caused by influence of heat and moisture on the ethylene-unsaturated ester copolymer, whereby heat and moisture resistance of the sealing film can be improved. Therefore, high transparency of the solar cell sealing film can be maintained without occurrence of cloudy, even if the solar cell is used in severe environment such as high temperature and humidity condition over a long duration.

The mass ratio (A/T) of the polyfunctional (meth)acrylate (A) to the triallyl isocyanurate (T) is 0.06 to 0.3, preferably 0.15 to 0.3.

The content of the triallyl isocyanurate in the sealing film is preferably in the range of 0.5 to 7.5 parts by weight, more preferably in the range of 1.0 to 7.5 parts by weight and particularly preferably in the range of 0.6 to 5.0 parts by weight of the ethylene-unsaturated ester copolymer. The use of the triallyl isocyanurate in the foregoing content can provide a sealing film having a further reduced crosslinking or curing time and further improved heat and moisture resistance.

The polyfunctional (meth)acrylate in the sealing film has 5 or more, preferably 5 to 8, particularly preferably 5 to 6 (meth)acryloyl groups in the molecule.

The polyfunctional (meth)acrylate is preferably obtained by an esterification reaction of a multiple alcohol having 5 or more hydroxyl group with acrylic acid and/or methacrylic acid. Penta- or higher-hydric alcohol, preferably penta- or hexa-hydric alcohol is preferably employed as the multiple alcohol. Specifically, examples of the multiple alcohol include dipentaerythritol, tripentaerythritol and tetrapentaerythritol.

Examples of the polyfunctional (meth)acrylate include dipentaerythritol hexa(meth)acrylate, dipentaerythritol penta(meth)acrylate, tripentaerythritol octa(meth)acrylate and tripentaerythritol hepta(meth)acrylate. Particularly, dipentaerythritol hexa(meth)acrylate is preferably used, because a crosslinking or curing time of the sealing film can be significantly reduced.

In the present invention, (meth)acrylate indicates an acrylate or a methacrylate.

The content of the polyfunctional (meth)acrylate in the sealing film is preferably in the range of 0.15 to 0.5 parts by weight, particularly preferably in the range of 0.3 to 0.5 parts by weight based on 100 parts by weight of the ethylene-unsaturated ester copolymer. The use of the polyfunctional (meth)acrylate in the foregoing content can provide the sealing film having a further reduced crosslinking or curing time and further improved heat and moisture resistance.

The sealing film of the present invention preferably contains an organic peroxide as the crosslinker. Any organic peroxides that can be decomposed at a temperature of not less than 100° C. to generate radical(s) can be employed as the organic peroxide. The organic peroxide is generally selected in the consideration of film-forming temperature, conditions for preparing the composition, curing temperature, heat resistance of body to be bonded, storage stability. In particular, it is preferable to use a material having a decomposition temperature of not less than 70° C., particularly 80 to 120° C. in a half-life of 10 hours.

From the viewpoint of a compatibility of the organic peroxide with an ethylene-unsaturated ester copolymer, examples of the organic peroxide preferably include 2,5-dimethylhexane-2,5-dihydroperoxide, 2,5-dimethyl-2,5-di(tert-butylperoxy)hexane, 3-di-tert-butylperoxide, dicumyl peroxide, 2,5-dimethyl-2,5-di(tert-butylperoxy)hexyne, tert-butylcumylperoxide, α,α'-bis(tert-butylperoxyisopropyl)benzene, α,α'-bis(tert-butylperoxy)diisopropylbenzene, n-butyl-4,4-bis(tert-butylperoxy)butane, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, benzoyl peroxide. The organic peroxide can be used singly, or in combination of two or more kinds.

As the organic peroxide, it is particularly preferable to use 2,5-dimethyl-2,5-di(tert-butylperoxy)hexane, which gives the solar cell sealing film having superior heat and moisture resistance.

The content of the organic peroxide in the sealing film is preferably in the range of 1.0 to 2.0 parts by weight, more preferably in the range of 1.0 to 1.5 parts by weight based on 100 parts by weight of an ethylene-unsaturated ester copolymer. The use of the crosslinker in the foregoing content can adequately bring out excellent bonds showing sufficient resistance to cleavage caused by the influence of heat and moisture on the ethylene-unsaturated ester copolymer, whereby heat and moisture resistance of the sealing film can be improved.

The solar cell sealing film of the present invention comprises an ethylene-unsaturated ester copolymer as an organic resin. Examples of the unsaturated ester monomer of the ethylene-unsaturated ester copolymer include such as unsaturated carboxylic acids esters, such as methyl acrylate, ethyl acrylate, isobutyl acrylate, n-butyl acrylate, isooctyl acrylate, methyl methacrylate, isobutyl methacrylate, dimethyl maleate and diethyl maleate and vinyl esters such as vinyl acetate and vinyl propionate. In particular, vinyl acetate is preferred.

A content of vinyl acetate recurring unit in ethylene-vinyl acetate copolymer (EVA) is preferably in the range of 20 to 35 parts by weight, more preferably 20 to 30 parts by weight, especially 24 to 28 parts by weight based on 100 parts by weight of the EVA. When the content of vinyl acetate recurring unit in the EVA is in the above-mentioned range, the sealing film can be prevented from becoming cloudy in high temperature and humidity environment.

The sealing film may further contain a silane-coupling agent. The use of the silane-coupling agent enables to form the solar cell sealing film having superior adhesive strength. Examples of the Silane-coupling agents include γ-chloropropylmethoxysilane, vinylethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β(3,4-epoxycyclohexyl)ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. The silane-coupling agents can be used singly, or in combination of two or more kinds. Especially, γ-methacryloxypropyltrimethoxysilane is preferred.

The content of the silane-coupling agents is preferably in the range of 0.1 to 0.7 parts by weight, particularly in the range of 0.3 to 0.65 parts by weight based on 100 parts by weight of the ethylene-unsaturated ester copolymer.

The sealing film may further contain various additives such as plasticizers, and epoxy group containing compounds for improvement or adjustment of various properties of the film (e.g., mechanical strength, optical characteristics such as transparency, heat-resistance, light-resistance, or crosslinking rate, etc.), if necessary.

Generally speaking, polybasic acid esters and polyhydric alcohol esters can be used as the above-mentioned plasticizer, although there are not particular restrictions to plasticizer to be used. Examples of the plasticizers include dioctyl phthalate, dihexyl adipate, triethylene glycol-di-2-ethylbutyrate, butyl sebacate, tetraethylene glycol diheptanoate and triethylene glycol dipelargonate. The plasticizers can be used singly, or in combination of two or more kinds. The content of the plasticizer preferably is not more than 5 parts by weight based on 100 parts by weight of ethylene-unsaturated ester copolymer.

Examples of the epoxy group containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether.

The epoxy group containing compounds is preferably in the range of 0.5 to 5.0 parts by weight, particularly in the range of 1.0 to 4.0 parts by weight based on 100 parts by weight of ethylene-unsaturated ester copolymer.

Furthermore, the sealing film may further contain ultraviolet absorbent, light stabilizer and antioxidant.

When the sealing film contains the ultraviolet absorbent, the ethylene-unsaturated ester copolymer can be prevented from deteriorating, yellowing and becoming cloudy due to light irradiation or the like. There is no particular restriction to ultraviolet absorbent to be used in the present invention. Preferable examples of the ultraviolet absorbent are benzophenone-type ultraviolet absorbents such as 2-hydroxy-4-methoxybenzophenone, 2-hydroxy-4-n-dodecyloxybenzophenone, 2,4-dihydroxybenzophenone, 2,2'-dihydroxy-4-methoxybenzophenone and 2-hydroxy-4-n-octoxybenzophenone. Additionally, the content of the benzophenone-type ultraviolet absorbent is preferably in the range of 0.01 to 5 parts by weight based on 100 parts by weight of ethylene-unsaturated ester copolymer.

When the sealing film contains the light stabilizer, the ethylene-unsaturated ester copolymer can be prevented from deteriorating, yellowing and getting cloudy due to light irradiation or the like. As the light stabilizer, a so-called hindered amine light stabilizer is preferred. Examples of the light stabilizer include LA-52, LA-57, LA-62, LA-63, LA-63p, LA-67 and LA-68 (each manufactured by ADEKA Co., Ltd.), Tinuvin 744, Tinuvin 770, Tinuvin 765, Tinuvin 144, Tinuvin 622LD and CHIMASSORB 944LD (each manufactured by Ciba Specialty Chemicals Co., Ltd.), and UV-3034 (each manufactured by B. F. Goodrich). The light stabilizers can be each used singly, or in combination of two or more kinds. The content of the light stabilizer is preferably in the range of 0.01 to 5 parts by weight based on 100 parts by weight of ethylene-unsaturated ester copolymer.

Examples of the antioxidants include hindered phenol-type antioxidants such as N,N'-hexan-1,6-diyl-bis[3-(3,5-di-tert-butyl-4-hydroxyphenyl) propionamide], phosphorus-type heat stabilizers, lactone-type heat stabilizers, vitamin E-type heat stabilizers and sulfur-type heat stabilizers.

The solar cell sealing film of the invention can be prepared in accordance with heretofore known processes. For example, the sealing film can be prepared by molding a composition including the above-discussed materials into a sheet-shaped article by extrusion molding or calendar molding (calendaring). Otherwise, the composition is dissolved in a solvent, the thus obtained solution is applied to an appropriate support by an appropriate coater, and then the applied solution is dried to form a coated film. Thus, a sheet-shaped article can be prepared. Additionally, the heating temperature at the film-formation is preferably a temperature that the crosslinker cause no reaction or little reactions. For instance, the temperature is preferably in the range of 40 to 90° C., particularly in the range of 50 to 90° C. Afterward the solar cell sealing film can be cross-linked or cured for sealing according to a conventional process such as the application of heating and pressure. The solar cell sealing film of the invention does not have any particular restriction on the thickness, which is generally in the range of 50 μm to 2 mm.

The solar cell obtained by use of the solar cell sealing film of the invention does not have any particular restriction on the structure. Examples of the structure include a structure that photovoltaic elements are sealed through the solar cell sealing films between a transparent front side protection material and a backside protection material. In the invention, "front side" corresponds to a side of the photovoltaic element irradiated with the light (light-receiving side), whereas "backside" corresponds to the reverse side of the light-receiving side of the photovoltaic elements.

For sufficiently sealing the photovoltaic elements in the solar cell, for instance, a transparent front side protection material 11, a front side sealing film 13A, photovoltaic elements 14, a backside sealing film 13B and a backside protection material 12 can be laminated in this order, as shown in FIG. 1. Thereafter, the sealing film can be crosslinked or cured according to a conventional process such as the application of heating and pressure.

For performance of the application of heating and pressure, the laminated body can be introduced into a vacuum laminator, and bonded under heating and pressure in the conditions of temperature of 135 to 180° C., preferably 140 to 180° C., especially 155 to 180° C. and press pressure of 0.1 to 1.5 kg/cm$^2$. This heating and pressure enables the crosslinking of the ethylene-unsaturated ester copolymer contained in the front side sealing film 13A and the backside sealing film 13B, whereby the transparent front side protection material 11, the backside protection material 12 and the photovoltaic elements 14 are combined through the front side sealing film 13A and the backside sealing film 13B to seal the photovoltaic elements 14.

In addition, the solar cell sealing film of the invention can be used for not only a solar cell using single-crystalline or polycrystalline silicone crystal type photovoltaic elements as shown in FIG. 1, but also thin-film solar cells, such as thin-film silicon type solar cell, an amorphous silicon film type solar cell and copper indium selenide (CIS) type solar cell. Examples of a structure of thin-film solar cell include;

a structure that on a thin-film photovoltaic element formed on surface of a transparent front side protection material such as a glass substrate, a polyimide substrate and a fluorine resin type transparent substrate by chemical vapor deposition method, etc., the solar cell sealing film of the invention and a backside protection material are superposed and adhesively combined, a structure that on a thin-film photovoltaic element formed on a surface of a backside protection material, the solar cell sealing film of the invention and a transparent front side protection material are superposed and adhesively combined, and a structure that a transparent front side protection material, a front side solar cell sealing film, a thin-film photovoltaic element, a backside solar cell sealing film and a backside protection material are laminated in this order, and adhesively combined.

The solar cell sealing film of the invention contains the polyfunctional (meth)acrylate having 5 or more (meth)acryloyl groups in the molecule and triallyl isocyanurate in the specified ratio, whereby the sealing film can be crosslinked or cured in a short time, and a time period required for the step for sealing the photovoltaic elements can be reduced. Therefore, the application of heating and pressure to the laminate can be conducted only for the time period of 3 to 15 minutes, especially 5 to 10 minutes.

Furthermore, when a solar cell is used in the summer, a surface temperature of the solar cell may become 70° C. or more, and humidity of the environment may become 80% RH or more. In such a high temperature and humidity environment, the use of the solar cell sealing film of the invention can prevent the sealing film from becoming cloudy thereby maintaining high transparency. Therefore, the solar cell of the invention shows superior electric generating performance.

The transparent front side protection material used in the solar cell of the invention is generally a glass substrate such as silicate glass. The thickness of the glass substrate is generally in the range of 0.1 to 10 mm, preferably 0.3 to 5 mm. The glass substrate can be chemically or thermally tempered.

The backside protection material for use in the invention is generally a plastic film such as polyethylene terephthalate (PET). From the viewpoint of heat resistance and moisture resistance, a fluorinated polyethylene film or a plastic film with deposited membrane consisted of silver on surface of the film, or especially a film having structure of fluorinated polyethylene film/Al/fluorinated polyethylene film laminated in this order is preferable.

The solar cell (including thin-film solar cell) of the invention is characterized by the specific sealing films used as the front side and/or the backside sealing film. Namely, there is no particular restriction on the materials of the solar cell except for the sealing films (i.e., transparent front side protection material, backside protection material, photovoltaic elements, etc.). Those materials can have the same structures/compositions as those in heretofore known solar cells.

EXAMPLES

The invention is illustrated in detail using the following Examples. The invention is not restricted by the following Examples.

Example 1

Materials shown in the following formulation were fed to a roll mill, and kneaded at 70° C. to prepare a composition for a solar cell sealing film. The composition for a sealing film was formed by calendaring at temperature of 70° C. After the resultant composition was allowed to stand to be cool, a solar cell sealing film (thickness: 0.6 mm) was prepared.

The formulation of the sealing film:
EVA (content of vinyl acetate based on 100 wt. parts of EVA: 26 wt. parts); 100 weight parts,
crosslinker (2,5-dimethyl-2,5-di(tert-butylperoxy)hexane); 1.4 weight parts,
triallyl isocyanurate (TAIL); 2.0 weight parts, and
polyfunctional (meth)acrylate 1 (dipentaerythritol hexaacrylate); 0.15 weight parts.

Examples 2 to 7 and Comparative Examples 1 to 6

In Examples 2 to 7 and Comparative Examples 1 to 6, solar cell sealing films were prepared in the same manner as in Example 1, except that the amounts of the triallyl isocyanurate and the polyfunctional (meth)acrylate 1 were changed into those in Table 1.

Comparative Examples 7 to 9

In Comparative Examples 7 to 9, solar cell sealing films were prepared in the same manner as in Example 1, except that polyfunctional (meth)acrylate 2 (pentaerythritol triacrylate) was used in an amount of 0.15 weight parts, 0.3 weight parts and 0.5 weight parts, respectively instead of the polyfunctional (meth)acrylate 1.

Comparative Examples 10 to 12

In Comparative Examples 10 to 12, solar cell sealing films were prepared in the same manner as in Example 1, except that polyfunctional (meth)acrylate 3 (pentaerythritol tetraacrylate) was used in an amount of 0.15 weight parts, 0.3 weight parts and 0.5 weight parts, respectively instead of the polyfunctional (meth)acrylate 1.

Comparative Examples 13 and 14

In Comparative Examples 13 and 14, solar cell sealing films were prepared in the same manner as in Example 1, except that polyfunctional (meth)acrylate 4 (trimethylolpropane trimethacrylate) was used in an amount of 0.1 weight parts and 0.5 weight parts, respectively instead of the polyfunctional (meth)acrylate 1.

Comparative Examples 15 and 16

In Comparative Examples 15 and 16, solar cell sealing films were prepared in the same manner as in Example 1, except that polyfunctional (meth)acrylate 5 (trimethylolpropane triacrylate) was used in an amount of 0.1 weight parts and 0.5 weight parts, respectively instead of the polyfunctional (meth)acrylate 1.

Comparative Examples 17 to 19

In Comparative Examples 17 to 19, solar cell sealing films were prepared in the same manner as in Example 1, except that polyfunctional (meth)acrylate 6 (neopentylglycol dimethacrylate) was used in an amount of 0.1 weight parts, 0.3 weight parts and 0.5 weight parts, respectively instead of the polyfunctional (meth)acrylate 1.

Comparative Example 20

In Comparative Example 20, solar cell sealing films were prepared in the same manner as in Example 1, except for using no polyfunctional (meth)acrylate 1.

Comparative Example 21

In Comparative Example 21, solar cell sealing films were prepared in the same manner as in Example 1, except that polyfunctional (meth)acrylate 1 was not used, and the amount of the crosslinker was changed into 0.7 weight parts.

Evaluation Methods (1) Light Beam Transmittance

The solar cell sealing film prepared above is interposed between glass plates (thickness: 3 mm) to prepare a laminate. The laminate is introduced into a vacuum laminator and bonded under pressure in vacuum at 100° C. for 10 minutes, subsequently, bonded in an oven of 155° C. for 45 minutes, whereby the solar cell sealing film is crosslinked or cured. Thereafter, the laminate is left in atmosphere of 85° C. and 85% RH for 1000 hours.

Light transmittance spectrums of the laminates before and after the environmental test in the thickness direction are measured in wavelength range of 300 to 1,200 nm at three places by using a spectrophotometer (U-4000, manufactured by Hitachi, Ltd.) and an average of the three measured values is calculated. The results are shown in Tables 1 to 3.

(2) HAZE Value

The solar cell sealing film prepared above is crosslinked or cured in the same manner as mentioned above. Thereafter, the laminate is left in atmosphere of 85° C. and 85% RH for 1000 hours.

HAZE values of the laminates before and after the environmental test are measured by using Digital HAZE computer HGM-2DP (manufactured by Suga Test Instruments Co., Ltd.) according to JIS-K-7105 (1981). The results are shown in Tables 1 to 3.

(3) Time to Reach 90% of Crosslink

A torque of the solar cell sealing film is measured by a method of Die cure test A defined in JIS-K6300-2. Specifically, the torque is measured by using an oscillating curemeter (Curelastometer type 5, manufactured by JSR Trading Co., Ltd.) as follows. After a die is heated to a temperature of 150° C., the sealing film is fit in the die. Subsequently, the die is closed, and the torque of the sealing film is continuously measured for 15 minutes with a strain being applied to the die in the conditions of temperature of 150° C., pressure of 343 kPa, angle of amplitude of ±0.03° and torsional frequency of 100 cpm. After that, a time to reach 90% of the maximum torque obtained from the measured crosslinking (curing) curve is determined. The results are shown in Tables 1 to 3.

TABLE 1

| | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|---|---|
| EVA | 100 | 100 | 100 | 100 | 100 | 100 | 100 | 100 | 100 | 100 | 100 | 100 | 100 |
| Crosslinker | 1.4 | 1.4 | 1.4 | 1.4 | 1.4 | 1.4 | 1.4 | 1.4 | 1.4 | 1.4 | 1.4 | 1.4 | 1.4 |
| TAIC | 2.0 | 2.0 | 2.0 | 3.0 | 3.0 | 0.5 | 0.5 | 2.0 | 2.0 | 2.0 | 2.0 | 0 | 0 |
| Polyfunctional (meth)acrylate 1 | 0.15 | 0.3 | 0.5 | 0.9 | 0.22 | 0.03 | 0.15 | 0.06 | 0.1 | 0.62 | 0.8 | 0.15 | 0.3 |
| Polyfunctional (meth)acrylate/TAIC | 0.075 | 0.15 | 0.25 | 0.3 | 0.073 | 0.06 | 0.3 | 0.03 | 0.05 | 0.31 | 0.4 | — | — |
| (before the environmental test) Light beam transmittance [%] | 80.8 | 81.0 | 81.1 | 80.9 | 80.9 | 80.8 | 81.1 | 80.7 | 80.7 | 80.6 | 80.5 | 80.1 | 80.2 |
| (after the environmental test) Light beam transmittance [%] | 79.9 | 80.2 | 80.1 | 79.7 | 79.9 | 79.8 | 79.9 | 78.0 | 78.3 | 75.0 | 74.6 | 70.3 | 71.5 |
| (before the environmental test) HAZE value [%] | 0.9 | 0.8 | 0.8 | 0.8 | 0.8 | 0.8 | 0.8 | 0.9 | 0.9 | 0.8 | 0.9 | 0.8 | 0.8 |
| (after the environmental test) HAZE value [%] | 20.7 | 19.1 | 18.4 | 19.9 | 19.9 | 20.0 | 20.2 | 21.0 | 20.8 | 40.5 | 45.3 | 65.1 | 60.3 |
| Time to reach 90% of crosslink [minutes] | 9.5 | 9.4 | 9.5 | 9.5 | 9.3 | 9.6 | 9.6 | 10.3 | 10.5 | 10.7 | 10.9 | 13.1 | 12.8 |

Note)
polyfunctional (meth)acrylate 1: dipentaerythritol hexaacrylate

TABLE 2

| | Comp. Ex. 7 | Comp. Ex. 8 | Comp. Ex. 9 | Comp. Ex. 10 | Comp. Ex. 11 | Comp. Ex. 12 | Comp. Ex. 13 | Comp. Ex. 14 |
|---|---|---|---|---|---|---|---|---|
| EVA | 100 | 100 | 100 | 100 | 100 | 100 | 100 | 100 |
| Crosslinker | 1.4 | 1.4 | 1.4 | 1.4 | 1.4 | 1.4 | 1.4 | 1.4 |
| TAIC | 2.0 | 2.0 | 2.0 | 2.0 | 2.0 | 2.0 | 2.0 | 2.0 |
| Polyfunctional (meth)acrylate 2 | 0.15 | 0.3 | 0.5 | 0 | 0 | 0 | 0 | 0 |
| Polyfunctional (meth)acrylate 3 | 0 | 0 | 0 | 0.15 | 0.3 | 0.5 | 0 | 0 |
| Polyfunctional (meth)acrylate 4 | 0 | 0 | 0 | 0 | 0 | 0 | 0.1 | 0.5 |
| (before the environmental test) Light beam transmittance [%] | 81.0 | 81.1 | 81.2 | 80.9 | 81.0 | 81.1 | 80.9 | 81.0 |
| (after the environmental test) Light beam transmittance [%] | 78.0 | 79.1 | 79.2 | 79.1 | 79.1 | 79.2 | 76.3 | 77.1 |

TABLE 2-continued

|  | Comp. Ex. 7 | Comp. Ex. 8 | Comp. Ex. 9 | Comp. Ex. 10 | Comp. Ex. 11 | Comp. Ex. 12 | Comp. Ex. 13 | Comp. Ex. 14 |
|---|---|---|---|---|---|---|---|---|
| (before the environmental test) HAZE value [%] | 0.5 | 0.4 | 0.6 | 0.6 | 0.5 | 0.6 | 0.4 | 0.3 |
| (after the environmental test) HAZE value [%] | 15.1 | 14.3 | 12.2 | 11.3 | 11.0 | 10.5 | 40.1 | 35.5 |
| Time to reach 90% of crosslink [minutes] | 10.4 | 10.3 | 10.3 | 10.2 | 10.2 | 10.1 | 9.9 | 9.8 |

Note)
polyfunctional (meth)acrylate 2: pentaerythritol triacrylate
polyfunctional (meth)acrylate 3: pentaerythritol tetraacrylate
polyfunctional (meth)acrylate 4: trimethylolpropane trimethacrylate

TABLE 3

|  | Comp. Ex. 15 | Comp. Ex. 16 | Comp. Ex. 17 | Comp. Ex. 18 | Comp. Ex. 19 | Comp. Ex. 20 | Comp. Ex. 21 |
|---|---|---|---|---|---|---|---|
| EVA | 100 | 100 | 100 | 100 | 100 | 100 | 100 |
| Crosslinker | 1.4 | 1.4 | 1.4 | 1.4 | 1.4 | 1.4 | 1.4 |
| TAIC | 2.0 | 2.0 | 2.0 | 2.0 | 2.0 | 2.0 | 2.0 |
| Polyfunctional (meth)acrylate 5 | 0.1 | 0.5 | 0 | 0 | 0 | 0 | 0 |
| Polyfunctional (meth)acrylate 6 | 0 | 0 | 0.1 | 0.3 | 0.5 | 0 | 0 |
| (before the environmental test) Light beam transmittance [%] | 80.9 | 81.0 | 80.7 | 80.9 | 80.8 | 80.6 | 80.0 |
| (after the environmental test) Light beam transmittance [%] | 76.2 | 76.4 | 70.1 | 72.1 | 74.4 | 75.8 | 74.4 |
| (before the environmental test) HAZE value [%] | 0.4 | 0.4 | 0.5 | 0.5 | 0.6 | 0.5 | 0.8 |
| (after the environmental test) HAZE value [%] | 35.1 | 30.3 | 66.6 | 68.8 | 70.8 | 75.0 | 80.1 |
| Time to reach 90% of crosslink [minutes] | 9.8 | 9.7 | 10.6 | 10.8 | 10.9 | 9.9 | 12.3 |

Note)
polyfunctional (meth)acrylate 5: trimethylolpropane triacrylate
polyfunctional (meth)acrylate 6: neopentylglycol dimethacrylate As shown in Tables 1 to 3, it is apparent that the solar cell sealing film of the invention can be crosslinked in a short time, and the use of the sealing film can prevent the sealing film from becoming cloudy thereby maintaining high transparency over a long duration in high temperature and humidity environment.

DESCRIPTION OF THE REFERENCE NUMBERS

11: transparent light-receiving side (front side) protection material
12: backside protection material
13A: light-receiving side (front side) sealing film
13B: backside sealing film
14: photovoltaic element

The invention claimed is:

1. A solar cell sealing film, comprising:
ethylene-vinyl acetate copolymer,
an organic peroxide, and
crosslinking auxiliary agents,
wherein the organic peroxide is 2,5-dimethyl-2,5-di(tert-butylperoxy)hexane,
wherein the solar cell sealing film comprises a polyfunctional (meth)acrylate having 6 (meth)acryloyl groups in the molecule and triallyl isocyanurate as the crosslinking auxiliary agents,
a mass ratio of the polyfunctional (meth)acrylate to the triallyl isocyanurate is 0.06 to 0.3 parts of polyfunctional (meth)acrylate per 1 part of triallyl isocyanurate,
a content of the triallyl isocyanurate is 0.5 to 3.0 parts by weight based on 100 parts by weight of the ethylene-vinyl acetate copolymer, and
a content of the polyfunctional (meth)acrylate is 0.15 to 0.5 part by weight based on 100 parts by weight of the ethylene-vinyl acetate copolymer.

2. The solar cell sealing film as defined in claim 1, wherein the polyfunctional (meth)acrylate is dipentaerythritol hexa (meth)acrylate.

3. The solar cell sealing film as defined in claim 1, wherein a content of the organic peroxide is 1.0 to 2.0 parts by weight based on 100 parts by weight of the ethylene-vinyl acetate copolymer.

4. The solar cell sealing film according to claim 1, wherein the content of the polyfunctional (meth)acrylate is 0.3 to 0.5 part by weight based on 100 parts by weight of the ethylene-vinyl acetate copolymer.

5. A solar cell having a structure where photovoltaic elements are sealed through solar cell sealing film(s) between a transparent front side protection material and a backside protection material,
wherein at least one of the solar cell sealing films is the solar cell sealing film as defined in claim 1.

6. The solar cell according to claim 5, wherein the solar cell sealing film is cured by heating.

* * * * *